United States Patent [19]

Neilson et al.

[11] 3,855,611

[45] Dec. 17, 1974

[54] THYRISTOR DEVICES

[75] Inventors: John Manning Savidge Neilson; Harry Weisberg, Somerville, both of N.J.

[73] Assignee: RCA Corporation, New York, N.Y.

[22] Filed: Apr. 11, 1973

[21] Appl. No.: 350,109

[52] U.S. Cl. ........................ 357/38, 357/13, 357/39, 357/89

[51] Int. Cl. ........................ h01l 11/10

[58] Field of Search ...... 317/235 AB, 235 T, 235 P, 317/235 AM

[56] References Cited

UNITED STATES PATENTS

| | | | |
|---|---|---|---|
| 3,231,796 | 1/1966 | Shombert | 317/235 AB |
| 3,317,746 | 5/1967 | Hutson | 317/235 P |
| 3,538,401 | 11/1970 | Chu | 317/235 AM |
| 3,600,647 | 8/1971 | Gray | 317/235 Am |
| 3,697,830 | 10/1972 | Dale | 317/235 AB |

*Primary Examiner*—Stanley D. Miller, Jr.
*Assistant Examiner*—William D. Larkins
*Attorney, Agent, or Firm*—H. Christoffersen; M. Y. Epstein

[57] ABSTRACT

A thyristor has at least four semiconducting regions, adjacent regions being of opposite type conductivity, one of the regions comprising a base region of the device bounded by blocking PN junctions, the base region including a portion of relatively high conductivity, and the PN junctions bordering regions of semiconductor material of relatively low conductivity.

10 Claims, 5 Drawing Figures

THYRISTOR DEVICES

The present invention relates to semiconductor devices, and in particular, relates to a class of semiconductor switching and control devices known as thyristors.

One type of thyristor, known as a controlled rectifier, is a semiconductior switch having four in-series regions of semiconductor material of alternate type conductivity, and having anode, cathode, and gate electrodes. These devices are usually fabricated from silicon. In one state, the silicon controlled rectifier (SCR) is non-conductive (blocking) until an appropriate voltage or current pulse is applied to the gate electrode, at which point current flows from the anode to the cathode and delivers power to a load circuit. If the SCR is reverse biased, it is non-conductive, and cannote be turned on by a gating signal. Once conduction starts, the gate loses control and current flows from the anode to the cathode until the current drops below a certain value (called the holding current), at which point the SCR turns off and the gate electrode regains control.

Another type of thyristor is bi-directional and exhibits the gate control characteristic in both current directions. This device is commonly referred to as a triac, and is the device equivalent of two SCR's connected in parallel with opposing polarities, and having a common gate electrode.

These types of thyristors are successfully employed in a wide variety of applications. However, there is a continuing need to improve the operating characteristics and efficiency of these devices. For example, one of the recurring problems associated with both SCR's and triacs is the susceptibility to "punchthrough," which is a breakdown condition. Punchthrough can occur when the depletion region associated with a reverse biased junction of the device spreads sufficiently across one of the intermediate blocking regions to cause the device to turn on without a gating signal. It is desirable to employ SCR's and triacs that are not susceptible to punchthrough.

THE DRAWING

DETAILED DESCRIPTION

Figure 1:
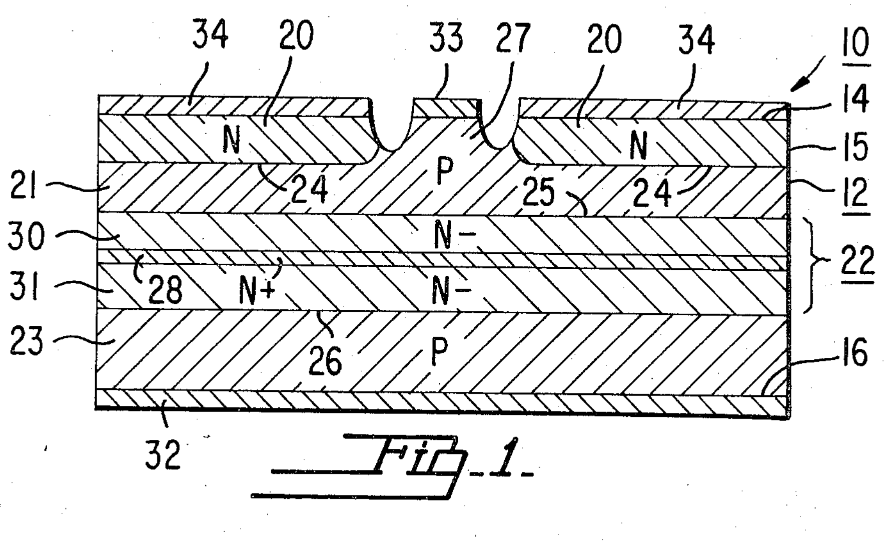
FIG. 1 is a cross section of a controlled rectifier (SCR) in accordance with the present invention.

A controlled rectifier 10 in accordance with the present invention is shown in FIG. 1 and described with reference thereto.

The controlled rectifier 10 is formed in a semiconductor body 12, as silicon, having upper and lower opposed surfaces 14 and 16, respectively, and a side surface 15. The plan configuration of the controlled rectifier 10 is not material to the present invention. The plan configuration, for example, may be circular.

Disposed within the semiconductor body 12 are a first region 20, a second region 21, a third region 22 (comprising three layers, described below), and a fourth region 23, the first and third regions 20 and 22 being of one conductivity type (N type in the device 10), and the second and fourth regions 21 and 23 being of a conductivity type (P) opposite to the one conductivity type. The four regions 20–23 thus alternate in conductivity thereby forming PN junctions between adjacent regions. The three PN junctions are numbered 24, 25, and 26 in FIG. 1. Also, in the embodiment shown in FIG. 1, the first region 20 is annular in shape and surrounds a portion 27 of the second region 21 which extends to the upper surface 14. The two regions 21 and 22 are disposed substantially between the two regions 20 and 23; the two regions 21 and 22 thus being referrred to as "intermediate" regions, and the two regions 20 and 23 being referred to as "external" regions.

To the extent so far described, the device 10 is quite similar to rectifier devices of known type. The device 10 differs from known devices, however, in that the third region 22 comprises a relatively thin layer 28 sandwiched between two relatively thick layers 30 and 31, with the thin layer 28 being more conductive (i.e., N+) than either of the thick layers 30 and 31 (shown as N− in FIG. 1). The thickness of the various layers 28, 30 and 31 depends upon the desired characteristics of the particular device involved, as described hereinafter, but, in general, the layer 28 is of substantially less thickness than either of the layers 30 and 31. For example, each of the layers 30 and 31 is preferably more than two times as thick as the layer 28. Likewise, although the different layers 28, 30, and 31 can be of various conductivities, depending upon the particular device involved, the conductivity in the layer 28 is preferably substantially greater than that in either layer 30 or 31 (e.g., generally more than 10 times as much). Additionally, the total quantity of lattice bound charges in the three layers 28, 30, and 31 is at least equal to that number of charges which will give rise to avalanche breakdown in the semiconductor material when the bound charges are uncovered by a depletion layer (e.g., $1.3 \times 10^{12}$ electrons or holes per $cm^2$ for silicon). By way of example, the thin layer 28 can have an impurity concentration of $5.2 \times 10^{15}$ atoms per/cc and a thickness of 0.1 mil; and the thick layers 30 and 31 can each have an impurity concentration of $5.0 \times 10^{13}$ atoms per/cc and a thickness of 2.0 mils, the device thus having a forward and reverse direction blocking capability of 1,000 volts.

The controlled rectifier 10 is provided with an anode electrode 32, a gate electrode 33, and a cathode electrode 34. The anode 32 is in ohmic contact with the fourth region 23 at the lower surface 16. The gate electrode 33 contacts the portion 27 of the second region 21 at the upper surface 14. The cathode 34 contacts the first region 20 at the upper surface 14.

The device 10 operates and is operated substantially similarly to known silicon controlled rectifiers. Thus, in accordance with known technology, the region 20 is the N emitter, the region 21 is the P base, and the region 23 is the P emitter. The region 22, comprising the three layers 28, 30, and 31, is the N base of the device. In the forward direction of operation, i.e., with a voltage on the anode 32 positive with respect to the cathode 34, the junction 25 between the P base 21 and the N base 22 is the blocking junction while the device is in the voltage blocking or non-conducting state. In the reverse direction, i.e., with a voltage on the anode 32 negative with respect to the cathode 34, the junction 26 between the P emitter 23 and the N base 22 is the blocking junction.

In the forward direction blocking state, a depletion region extends outwardly from the junction 25 into the two regions 21 and 22 defining the junction. The width of the depletion region is dependent upon the voltage applied across the device and upon the resistivity of the regions in which the depletion region is present. In certain prior art semiconductor controlled rectifiers, in which the N base comprises a single layer of N conductivity material, a problem is that with large voltages the depletion region can extend entirely across the N base and reach the P emitter. At such time holes are injected into the N base from the P emitter causing a breakdown of the device. This breakdown phenomenon, caused by the depletion region extending entirely across the N base of the device, is known as punchthrough. Likewise, in the reverse direction blocking condition, if the depletion region extends entirely across the N base from the junction between the N base and the P emitter, punchthrough occurs.

In accordance with the instant invention, the total charge in the layers 28, 30 and 31 is greater than that which will cause avalanche breakdown, with the result that voltage punchthrough across the base 22 does not occur. That is, as the depletion layer extends through the base region 22 from either junction 25 and 26, during forward or reverse direction voltage blocking operation, respectively, avalanche breakdown at the blocking junction occurs before the depletion layer extends entirely across the region 22. (Also, in conformity with conventional design practice, the conductivity of the P base 21 is sufficiently high so that punchthrough to the N emitter 20 does not occur during forward direction voltage blocking operation, and the conductivity of the P emitter 26 is sufficiently high to prevent punchthrough to the anode electrode 32 during reverse direction voltage blocking operation). By making the device avalanche breakdown limited rather than punchthrough limited, certain advantages are obtained, as described hereinafter.

In a preferred embodiment of the invention, the layers 30 and 31 are highly resistive (e.g., having an average resistivity in the order of 100 ohm-cm), and the layer 28 is highly doped to contain at least, and preferably more than, the minimum number of charges that will induce avalanche breakdown at either blocking junction 25 or 26 Also, the layer 28 is extremely thin, in the order of 0.1–0.3 mil.

One advantage of such preferred embodiment is that tne depletion region spreading outwardly from either junction 25 or 26 never penetrates the layer 28 (avalanche breakdown occurring before this can happen), with the result that the voltage blocking capability of the device in either direction is independent of the voltage blocking capability of the device in the opposite direction. MOre specifically, the foward direction blocking capability is substantially determined by the widths and conductivity charactertics of the layers 28 and 30 independently of the width and conductivity characteristics of the layer 31 (since the depletion layer from the junction 25 never extends into the laYer 31), and the reverse direction voltage blocking capability of the device is likewise substantially determined by the width and conductivity characteristics of the layers 28 and 31 indepdently of those of the layer 30. This allows greater flexibility in the design of devices of the type herein described, and, for a reason described hereinafter, the width of the base region 22 of devices in accordance with the instant invention can be less than that of the bases of certain devices made in accordance with the prior art.

Another advantage of the invention is that much larger tolerances in the impurity concentrations within the base region are acceptable in comparison with prior art devices. In certain prior art devices, the need to provide relatively thin base regions, for adequately high device switching speeds and low forward direction voltage drop, requires that the base region be of conductivity considerably higher than that of the intrinsic semiconductor material to avoid the punchthrough voltage problem. If, however, owing to manufacturing variations, the conductivity of the base regions of such prior art devices is higher than designed, the devices are subject to avalanche breakdown before the entire width of the base is "used up" by the depletion layer. Thus, in such prior art devices, the rated voltage capability is limited by the manufacturing variations which can be expected in the doping of the base regions. Also, as known, the higher the conductivity of the base regions, the wider need be these regions to provide a given voltage blocking capability.

With devices of the instant invention, however, provided the highly conductive layer 28 contains the minimum number of bound charges to cause avalanche breakdown, extremely large variations in the conductivity of the layer 28, significantly larger than normally encountered in conventional mass production manufacturing techniques, can be tolerated with little ill effect. This follows because, owing to the high conductivity of the layer 28, avalanche breakdown occurs when the depletion layer penetrates even a relatively short distance into the layer 28. Thus, the voltage breakdown capability of the device is determined almost entirely by the thickness of the layers 30 and 31, with the result that it is the location of the layer 28 with respect to the layers 30 and 31, rather than the conductivity of the layer 28, which affects the breakdown capabilities of the device. As generally known, the geometry of a multi-layered device is relatively easier to control than the doping thereof.

Additionally, provided the highly resistive layers 30 and 31 each contain a total number of bound charges less than the avalanching inducing number, it is only the width of the layers 30 and 31, somewhat independent of the conductivities thereof, which determines the voltage blocking capabilities of the device. Accordingly, the conductivity of the various layers 28, 30, and 31 constituting the base region 22 of the instant device is not as critical as is the case with the base regions of the aforedescribed prior art devices.

Also, because the layers 30 and 31 can be highly resistive without regard to the punchthrough problem, devices in accordance with the instant invention can generally use base regions which are thinner than those necessary in the prior are devices for the same voltage blocking capabilities.

In the design of the herein described devices, the highly conductive layer 28 is generally made as thin as possible to minimize the forward direction voltage drop when the device is in its conducting mode of operation.

While highly resistive layers 30 and 31 are generally preferred, as previously noted, different resistivities of the layers 30 and 31 can be used to provide various device characteristics, such as selected device switching characteristics, while still obtaining various advantages of the invention.

Figure 2:
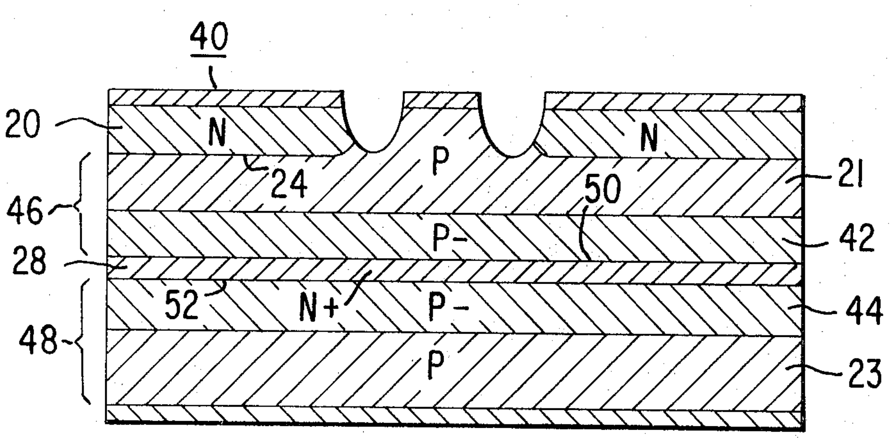
FIG. 2 is a cross section of an alternate construction of the controlled rectifier of FIG. 1.

The layers 30 and 31 need not be of the same conductivity type as that of the layer 28, or of the same conductivity type as each other; and, to the extent physically possible, the layers 30 and 31 can be intrinsic. Thus, for example, as shown in FIG. 2, a device 40 can be provided which is identical to the device 10 shown in FIG. 1 except that the layer 28 of N+ conductivity is sandwiched between two layers 42 and 44 of P− conductivity. Owing to the conductivity type of layers 42 and 44, these layers are parts of the P base, designated as 46 and including the region 21, and the P emitter, designated as 48 and including the region 23, resepectively. In this device, the N+ region 28 is the N base of the device, the N base 28 having a PN junction 50 with the P base 46, and PN junction 52 with the P emitter 48.

In operation, the device 40 operates substantially indentically to the device 10 except that the depletion region extends outwardly from the PN junctions 50 and 52 during forward or reverse direction blocking operation, respectively. The high conductivity of the N+ base 28 prevents spread of the depletion region through the layer 28 and thus prevents punchthrough. The layers 42 and 44 of relatively low conductivity, on the other hand, provide the device with high voltage capability. (Also, in conformity with conventional design practice, the P base layer 21 and the P emitter layer 23 on opposite sides of the P− layers 42 and 44, respectively, are of sufficiently high conductivity to prevent voltage punchthrough).

Figure 3:
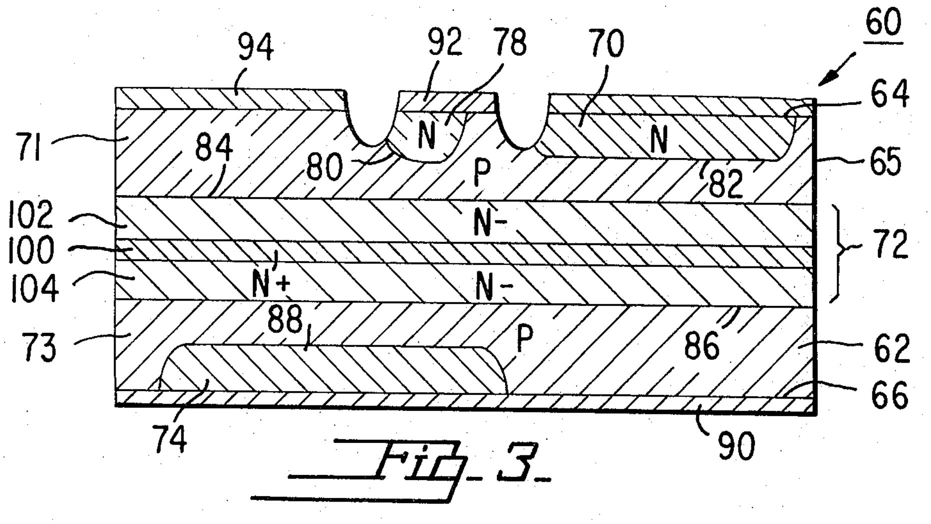
FIG. 3 is a cross section of a gate-controlled bi-directional thyristor (triac) in accordance with the present invention.

A triac 60, as an embodiment of the present invention, is shown in FIG. 3. The triac 60 is formed in a semiconductor body 62 having upper and lower surfaces 64 and 66 and a side surface 65 therebetween.

The triac 60 includes a first region 70, a second region 71, a third region 72 (comprising three layers, as described below), a fourth region 73, and a fifth region 74, the five regions being disposed between the two surfaces 64 and 66 and adjacent regions being of opposite type conductivity. That is, the regions 70, 72, and 74 are of one conductivity type (N type in the device shown in FIG. 3), and the regions 71 and 73 are of a conductivity type (P) opposite to the one conductivity type. The first region 70 and the second region 71 extend to the upper surface 64, and the fourth region 73 and the fifth region 74 extend to the lower surface 66. Also, a subregion 78 of N conductivity type extends into the second region 71 from the upper surface 64. At the junctions of the various regions, various PN junctions 80, 82, 84, 86, and 88 are present.

Electrodes for the device 60 comprise a terminal 90 contacting the lower surface 66; a gate 92 contacting a central portion of the second region 71 and the subregion 78; and another terminal 94 contacting both the first region 70 and the second region 71.

To the extent so far described, the device 60 is quite similar to triac devices of known type. The triac 60 differs from known devices in that the third region 72, disposed between the regions 71 and 73, comprises a relatively thin layer 100 of high conductivity (N+ in this embodiment) sandwiched between two relatively thick resistive layers 102 and 104 of the same type conductivity (N−).

Operation of the triac 60 is quite similar to that of known triac devices. The presence of the N+ layer 100 within the region 72 (the N base of the triac), however, is effective to prevent spread of the depletion layer entirely through the base 72 and thus prevent punchthrough of the base 72 during either reverse or forward blocking operation of the device. Other factors concerning the function and design of the region 72 are similar to these factors as discussed above in the description of the embodiments of the invention shown in FIGS. 1 and 2.

Figure 4:
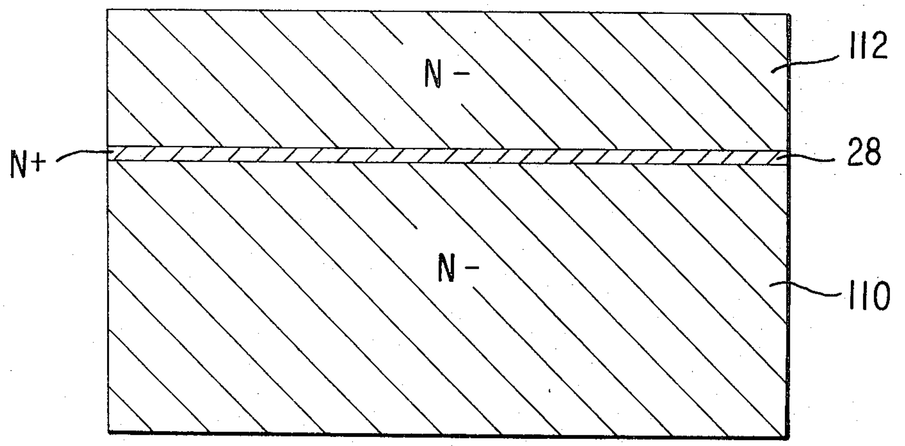
FIGS. 4 and 5 are cross-sections of a workpiece at successive steps in a process to fabricate the device shown in FIG. 1.

Processes and techniques for fabricating various devices embodying the instant invention are generally known to persons skilled in these arts. By way of example, however, a description of the fabrication of the controlled rectifier 10 is provided. The starting material is a highly resistive (N−) silicon wafer 110 (FIG. 4) having a thickness in the order of 10–15 mils, and a resistivity of about 100 ohm-cm. This material is to form, after further processing, the bottom layers 31 and 23 of the device 10.

Figure 5:
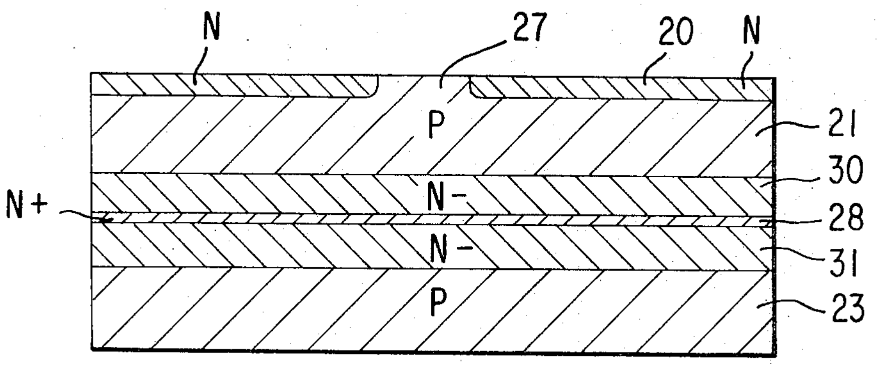

The wafer 110 is then treated with any one of a variety of known epitaxial deposition processes to successively deposit two monocrystalline epitaxial layers 28 and 112 thereon. The layer 28 has a thickness in the order of 0.2 mils and a resistivity (N+) of about 0.3 ohm-cm; the layer 112 has a thickness of between 3.0 – 4.0 mils and a resistivity (N−) of about 100 ohm-cm. After this deposition, silicon is removed from the bottom side of the wafer 110 by a process such as lapping, grinding, or etching, to bring the thickness of the workpiece into a thickness range of between 8–10 mils. Thereafter, the workpiece is treated in a diffusion furnace with a P type impurity, such as boron, to convert about 1.0–1.5 mils of the upper and lower N− regions of the workpiece to P conductivity (FIG. 5). This converts the lower side of the wafer into the two layers 23 and 31, and defines the upper layer 30 of the device 10. The workpiece is then subjected to another diffusion step to convert an annular portion of the P type upper region back to N type conductivity to define the layers 20 and 21, the layer 20 having a thickness in the order of 0.6–0.7 mils. The upper surface of the workpiece is then masked in a known manner and an annular groove having a depth greater than the thickness of the layer 20 is etched in the top surface of the workpiece to isolate the projection 27 of the region 21. The various regions of the device are thus present. The anode 32, gate 33, and cathode 34 electrodes are then provided in known fashion.

What is claimed is:

1. A gated switching device comprising:

a body of semiconductor material having four regions in series with one another, adjacent regions being of opposite type conductivity and having a PN junction therebetween, one of said regions being bounded by junctions which serve as voltage blocking junctions in the operation of said device, said one region including a first portion of high conductivity to prevent the spread of a depletion layer from either of said blocking junctions entirely across said one region during operation of said device, and each of said blocking junctions bordering second portions of said body each having, within a thickness greater than the thickness of said portion of high conductivity, a total number of bound charges insufficient, when uncovered by a depletion layer upon application of a voltage across said device, to cause avalanche breakdown.

2. A device as in claim 1 wherein said low conductivity portions are disposed contiguous to, and on opposite sides, of said portion of high conductivity.

3. A device as in claim 1 in which said first portion of high conductivity contains a number of bound charges sufficient, when uncovered by a depletion layer, to cause avalanche breakdown.

4. A device as in claim 1 in which each of said second portions is of the same conductivity type as said first portion.

5. A device as in claim 1 in which at least one of said second portion is of a conductivity type other than that of said first portion.

6. A semiconductor device comprising:

a semiconductor body having two opposed surfaces, and including at least four semiconducting regions between said two surfaces with a PN junction between adjacent regions;

said regions including two external regions each at one of said surfaces, and at least two intermediate regions between said external regions; and wherein one of said intermediate regions comprises a relatively thin layer and two relatively thick layers each one at an opposite side of said thin layer, said thin layer being more conductive than each of said thick layers, and said thin layer and said thick layers all being of the same conductivity type.

7. A device as recited in claim 6, further comrpising:

first and second electrodes each in ohmic contact with a different one of said external regions; and a third electrode is ohmic contact with the other of said intermediate regions.

8. A device as recited in claim 6, wherein the ratio between the thickness of each said thick layer to said thin layer is at least about 2:1.

9. A device as recited in claim 6, wherein the impurity concentration of said thin layer is at least 10 times greater than the impurity concentration of each said thick layer.

10. A bidirectional switching device comprising:

a semiconductor body having two opposed surfaces with a plurality of regions between said surfaces and with a PN junction between adjacent regions;

said regions including two external regions each at one of said surfaces, and three intermediate regions between said external regions;

said three intermediate regions including a central region interposed between the other two intermediate regions; and wherein said central region comprises a relatively thin layer and two relatively thick layers each on opposite sides of said thin layer, said thin layer being more conductive than each of said thick layers, and said thin layer and said thick layers all being of the same conductivity type.

* * * * *